United States Patent [19]

Mermelstein

[11] Patent Number: 5,130,654
[45] Date of Patent: Jul. 14, 1992

[54] MAGNETOLELASTIC AMORPHOUS METAL RIBBON GRADIOMETER

[75] Inventor: Marc D. Mermelstein, Chevy Chase, Md.

[73] Assignee: University of Virginia Alumni Patents Foundation, Charlottesville, Va.

[21] Appl. No.: 367,435

[22] Filed: Jun. 16, 1989

[51] Int. Cl.$^5$ .................... G01R 33/02; H01L 41/04; H01N 2/00
[52] U.S. Cl. .................................... 324/244
[58] Field of Search ............ 324/209, 244, 260, 253, 324/254, 255; 310/323, 328, 321

[56] References Cited

U.S. PATENT DOCUMENTS

| | | |
|---|---|---|
| 2,976,483 | 3/1961 | Moore et al. ............. 324/245 |
| 3,778,761 | 12/1973 | Cribbins . |
| 3,863,142 | 1/1975 | Werle . |
| 3,919,630 | 11/1975 | Oshima et al. . |
| 4,280,095 | 7/1981 | Hinton . |
| 4,323,848 | 4/1982 | Kuckes . |
| 4,386,318 | 5/1983 | Burbank et al. . |
| 4,605,899 | 8/1986 | Eumurian et al. . |
| 4,611,171 | 9/1986 | Woods ................... 324/253 |
| 4,656,421 | 4/1987 | Ellis et al. . |
| 4,693,000 | 9/1987 | Hoenig . |
| 4,703,266 | 10/1987 | Chiron et al. . |
| 4,769,599 | 9/1988 | Mermelstein . |
| 4,804,915 | 2/1989 | Hoenig . |

OTHER PUBLICATIONS

Mermelstein and Dandridge, "Low-frequency magnetic field detection with a magnetostrictive amorphous metal ribbon", Appl. Phys. Lett., 51: 545-547 (U.S.A. 1987).

*Primary Examiner*—Walter E. Snow
*Attorney, Agent, or Firm*—James C. Wray

[57] ABSTRACT

A single magnetostrictive amorphous metal sensor element is mounted on a piezoelectric resonator plate with an intervening layer of a viscous fluid, an oscillator stresses and vibrates the plate at a resonant frequency, creating a standing wave in the sensor element which is a metallic glass ribbon. Electromotive forces are generated in first and second pickup coils mounted at symmetrically spaced positions about the ribbon centerline. The electromotive force generated by each pickup coil is demodulated by a lock-in amplifier with a signal supplied by the oscillator. The demodulated outputs are amplified so as to balance the sensitivities. Outputs of amplifiers are provided to a differential amplifier which produces the gradiometer output indicative of magnetic field gradient.

7 Claims, 3 Drawing Sheets

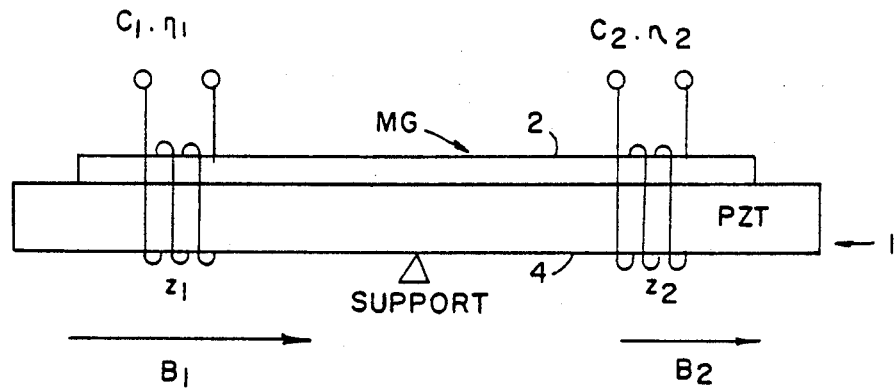
FIG. 1
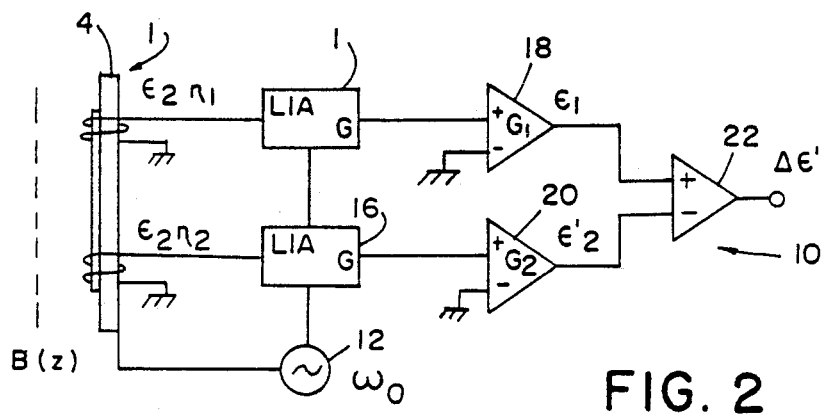
FIG. 2
FIG. 3
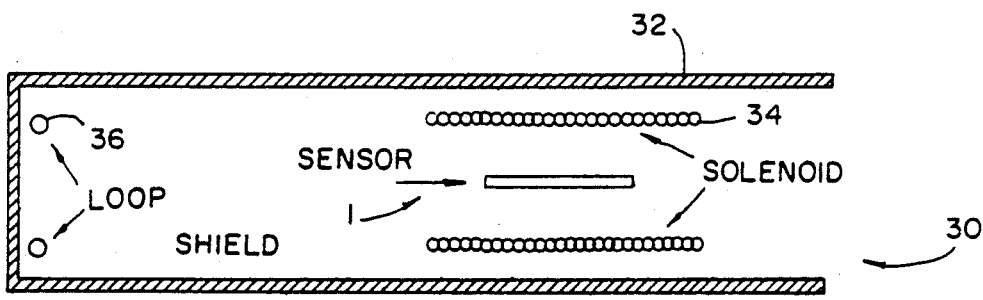

MAGNETOLELASTIC AMORPHOUS METAL RIBBON GRADIOMETER

BACKGROUND OF THE INVENTION

Determining magnetic field gradient is important for many things, including determining relative position and precise position location, and in identifying objects. Previously, magnetic field gradient has been determined by employing individual magnetic field sensors at widely spaced locations, and determining the magnetic fields at those locations.

A stress-driven magnetoelastic amorphous metal ribbon magnetometer which exhibits a minimum detectable field capability of 8.7 pT/$\sqrt{(Hz)}$ at 1.0 Hz has been described in Mermelstein, M.D., and Dandridge, A.: "Low frequency magnetic field detection with a magnetostrictive amorphous metal ribbon", Applied Physics Letters, 1987, Vol. 51, pp. 545-547. That device is constructed by interfacing a transversely field-annealed ribbon to a resonating piezoelectric plate with a viscous fluid. The piezoelectric plate is driven at the fundamental acoustic resonance corresponding to free end boundary conditions, thereby subjecting the mounted ribbon to an oscillating stress. The oscillating stress in the ribbon generates an oscillating magnetization whose amplitude is proportional to the signal field strength. The magnetization oscillations are detected with a centrally located pickup coil, and the signal field value is recovered with phase sensitive detection electronics.

Problems exist in the measuring of very small magnetic field gradients in geological surveying, medicine, and military applications. Widely separated magnetic field sensors encounter special problems with noise which requires complex systems for removal. Widely separated sensors are difficult to use and difficult to coordinate.

SUMMARY OF THE INVENTION

The present invention solves problems which exist in the prior art.

A single magnetostrictive amorphous metal sensor element is mounted on a piezoelectric resonator plate, an oscillator stresses and vibrates the plate at a resonant frequency, creating a standing wave in the sensor element which is a metallic glass ribbon which has been subjected to a transverse and planar field-annealing treatment.

Electromotive forces are generated in first and second pickup coils mounted at spaced positions along the ribbon. The electromotive force generated by each pickup coil is demodulated by a lock-in amplifier with a signal supplied by the oscillator. The demodulated outputs are amplified. Outputs of amplifiers are provided to a differential amplifier which produces the gradiometer output indicative of magnetic field gradient.

This invention provides a stress-driven magnetoelastic amorphous metal ribbon gradiometer.

Presented herein is a novel gradiometer which utilizes two pickup coils to measure the local magnetization fluctuations at differing locations in a single amorphous metal ribbon. A minimum detectable field gradient of 7.7 pT/cm$\sqrt{(Hz)}$ has been demonstrated with the present system.

A single magnetostrictive amorphous metal sensor element measures field gradients.

A stress standing wave is generated in a metallic glass ribbon by a piezoelectric plate. The local stress modulation produces a modulation in the ribbon longitudinal magnetization which, by virtue of the magnetostriction, is proportional to the low frequency magnetic field. The present invention uses two pickup coils to measure the magnetization fluctuations and therefore the local field strength at two distinct spatial points. The electromotive forces generated in the pickup coils are demodulated by lock-in amplifiers. Separate amplifiers have their gains adjusted to balance the magnetic field detection sensitivity of each pickup coil. The two sensitivities differ due to variations in the ribbon or plate. The two balanced signal voltages from the amplifiers are substracted by a differential amplifier, which provides the gradiometer output.

The present device is compact, using only one sensor element, and inexpensive. The associated electronics are simple and easily facilitate the balancing of the gradiometer. The single ribbon design enhances common mode rejection of noise.

A preferred magnetic field gradiometer has a piezoelectric plate, an oscillator connected to the plate for supplying electrical signals to the plate and vibrating the plate, a metallic glass ribbon mounted on the plate for vibrating with the plate, an intervening viscous fluid layer between the ribbon and plate which efficiently transfers the dynamic stress (corresponding to the acoustic resonance) from the piezoelectric plate to the metallic glass ribbon while attenuating low frequency stresses which generate noise, first and second pickups respectively mounted at first and second spaced locations along the ribbon, and first and second amplifiers respectively connected to the first and second pickups for amplifying signals from the pickups. A differential amplifier is connected to outputs of the first and second amplifiers for providing a signal of magnetic field gradient between the two positions.

Preferably the piezoelectric plate is supported medially, and the two pickups are equally spaced from the medial support.

In one embodiment the first and second amplifiers have different gains adjusted to balance inhomogeneities in the ribbon and piezoelectric plate.

Preferably first and second lock-in amplifiers are connected respectively between the first and second pickups and the first and second amplifiers. The first and second lock-in amplifiers also are connected to the oscillator for providing electrical oscillation signals to the lock-in amplifiers.

A preferred magnetostrictive gradiometer has a resonator, means for vibrating the resonator and a single magnetostrictive amorphous metal sensor element mounted on the resonator. Vibrating the resonator vibrates the amorphous metal sensor element through the intervening viscous fluid layer. First and second pickups are mounted near the single magnetostrictive amorphous metal sensor element at first and second spaced positions for picking up field changes at two distinct spacial points symmetrically located about the centerline on the single sensor element. First and second amplifiers respectively are connected to the first and second pickups. A differential amplifier is connected to outputs of the first and second amplifiers for producing an output signal from the differential amplifier which is related to difference in a magnetic field between the two spaced locations.

Preferably the resonator is a piezoelectric resonator, and an oscillator is connected to the piezoelectric resonator.

The first and second amplifiers may have gain adjusters for balancing magnetic field detection sensitivity of each pickup coil.

Preferably the amorphous metal sensor element is a metallic glass ribbon. The resonator produces a modulation in the ribbon magnetization which by virtue of magnetostriction is proportional to the low frequency magnetic field.

The preferred method of measuring magnetic field gradient includes producing regular standing wave local stress modulation in a single magnetostrictive amorphous metal sensor element, generating electromotive forces in each of two spacially separated pickup coils mounted along the sensor element, demodulating the electromotive forces according to stress modulation produced in the ribbon, separately amplifying the first and second electromotive forces, subtracting the two separately amplified electromotive forces and determining magnetic field gradient between the two pickup locations according to a difference in the amplified electromotive forces.

Preferably the producing standing waves comprises mounting the sensory element on a piezoelectric resonator and resonating the resonator with a signal from an oscillator.

The preferred demodulating comprises providing the output of the oscillator to first and second lock-in amplifiers.

The amplifying further comprises amplifying the first and second electromotive forces with different gains according to differences in the sensor element and piezoelectric resonator.

The preferred comparing comprises supplying the amplified first and second electromotive forces to a differential amplifier and providing the magnetometer output from the differential amplifier.

The above and further objects and features of the invention are apparent in the specification, which includes the above and ongoing description and the claims, and in the drawings.

BRIEF DESCRIPTION OF THE DRAWINGS

FIG. 1 is a schematic diagram of gradiometer sensor element.

FIG. 2 shows a gradiometer sensor element and electronic signal processing.

FIG. 3 schematically represents field generating coils and sensor element.

FIG. 4a shows response of magnetometer 1 to steps of $\pm 1.0$ nT in uniform field.

FIG. 4b shows response of magnetometer 2 to steps of $\pm 1.0$ nT in uniform field.

FIG. 4c shows gradiometer response to steps of 50 nT in uniform field.

FIG. 4d shows gradiometer response to steps of $\pm 0.5$ A flowing through current loop.

DETAILED DESCRIPTION OF THE DRAWINGS

Figure 4:
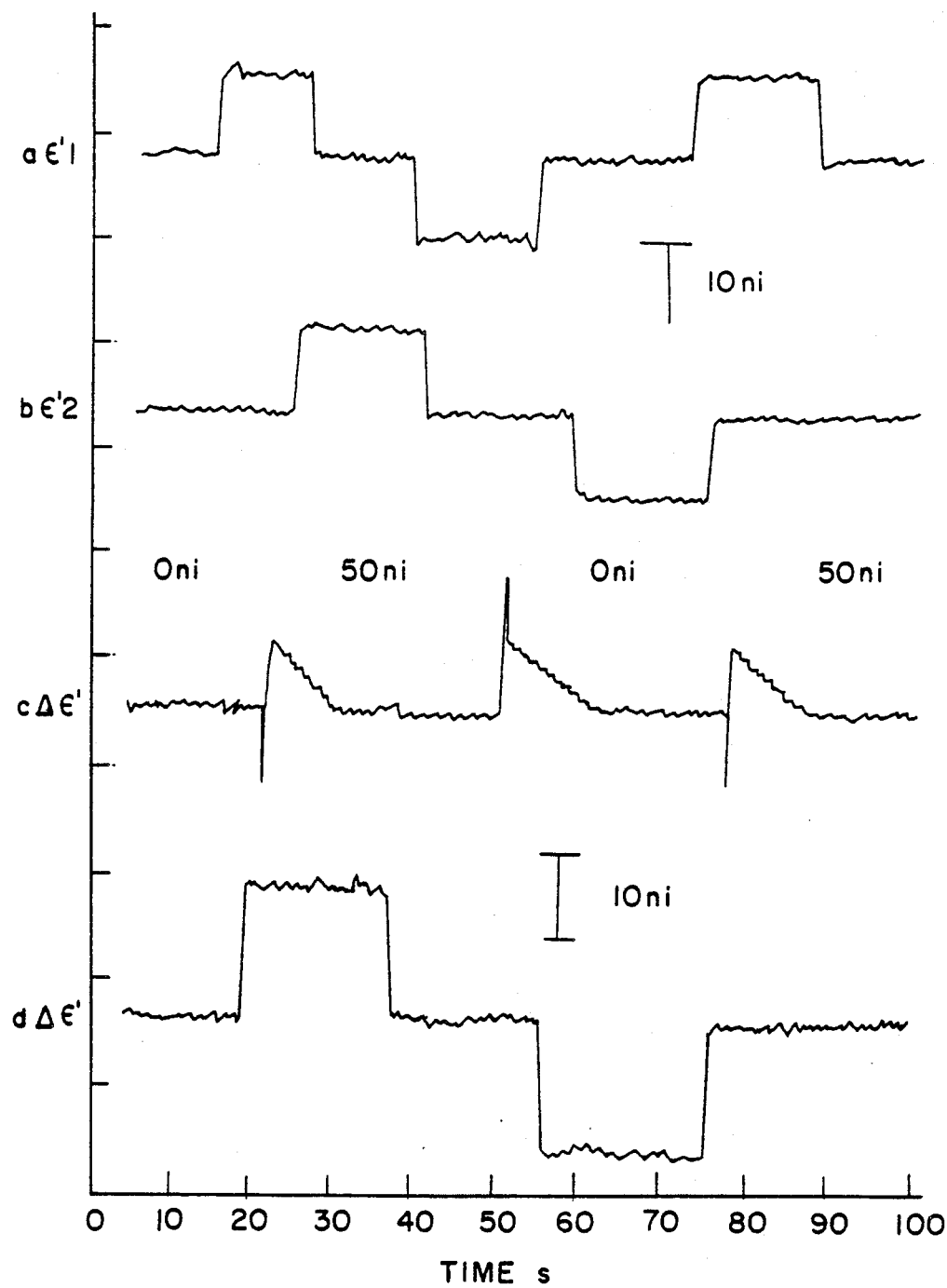
FIG. 4 magnetometer responses to fields generated in FIG. 3. Current flow generates measured differential field of $\approx 1.6$ nT. Each chart recorder trace represents successive measurements.

An example of the gradiometer sensor element 1 is illustrated in FIG. 1. Metallic glass (MG) ribbon 2 dimensions are preferably 2 in.$\times$0.5 in.$\times$25 $\mu$m. Piezoelectric (PZT) plate 4 dimensions are 2.5 in.$\times$0.625 in.$\times$0.6 mm. 200-turn pickup coil located at coordinates $Z_1$, $Z_2$ with a separation $\Delta z$ which is equal to 3.0 cm.

Electromotive force (EMF) amplitude generated at $z_1$ is $\epsilon_1 = \eta_1 B_1$ and that generated at $z_2$ is $\epsilon_2 = \eta_2 B_2$, where $\eta_{1,2}$ are the local intrinsic sensitivities, and $B_{1,2}$ are the local inductions. The device symmetry suggests that the two sensitivities are equal. However, it was found that this was not the case, presumably due to inhomogeneities in the ribbon and/or piezoelectric resonator.

The circuit 10 shown in FIG. 2 was used to balance the gradiometer. A voltage oscillator drives the piezoelectric plate 4 at the resonance frequence $\omega_o$. the individual EMFs are demodulated by the two lock-in amplifiers (LIAs) 14, 16 which provide a gain factor G. The LIA outputs, which are proportional to the two signal fields, are subsequently amplified 18, 20 with gains $G_1$ and $G_2$ which have been adjusted so that $\eta_1 G_2 = \eta_2 G_2$, thereby balancing the gradiometer. The field gradient is then given by: $\Delta B / \Delta z = \Delta \epsilon' / G \eta' \Delta z$ where $\Delta \epsilon' = G(G_1 \epsilon_1 - G_2 \epsilon_2)$, $\eta' = G_1 \beta_1 = G_2 \eta_2$, and $\Delta z = z_1 - z_2$ is the pickup coil separation.

To calibrate and test the gradiometer, the field generating coil arrangement 30 shown in FIG. 3 was constructed. A uniform induction field was generated by a solenoid 34 (within a shielded enclosure 32) exhibiting a 1.0 nT/$\mu$A conversion coefficient. The gradient field was supplied by a remotely located current loop 36. Solenoid 34 is 6 in. long and has a 2.5 in. diameter. Loop 36 has a 3.5 in. diameter and is located 9 in. away from ribbon center. The experiment was performed inside a mu-metal shield chamber 32.

FIGS. 4a and 4b show the responses of the individual pickup coils to a 1.0 nT step in the uniform field. The gains of the two amplifiers have been adjusted so that $\eta' = 2.0$ nV/pT. Power spectrum analyzer measurements of the individual magnetometer outputs determined an RMS noise level of $[B_1]_{RMS} = 21$ pT/$\sqrt{(Hz)}$ and $[B_2]RMS = 16$ pT/$\sqrt{(Hz)}$ at 1.0 Hz with an approximate 1/f rise in the noise floor. As a test of the balancing, the gradiometer was subjected to a 50 nT step in the uniform field. FIG. 4c exhibits the output of the differential amplifier. The discontinuous change in the uniform field produced a transient deviation of the differential output. A short time later ($\approx$ 10s), the gradiometer returned to its baseline value as required. This relaxation may be associated with the viscous fluid or a magnetic after-effect. The exact origin is currently under investigation. FIG. 4d shows the gradiometer response to current steps in the loop of $\pm 0.5$ A. The loop is found to generate a differential field of approximately 1.6 nT. The calculated value for the differential field is $\approx 20$ nT. This discrepancy between the measured and calculated differential field values is attributed to the large demagnetizing fields present in the ribbon at the pickup coil locations.

Figure 5:
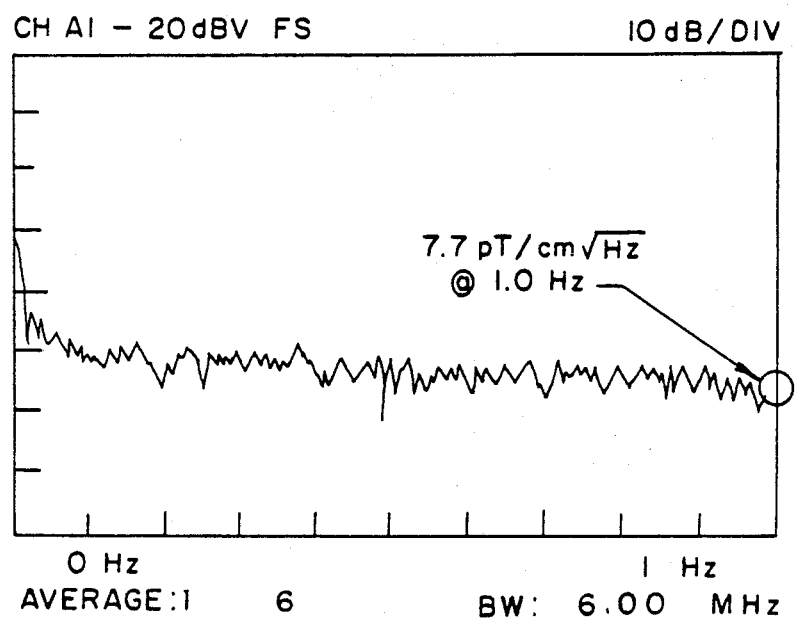
FIG. 5 shows measured root power spectral density of gradiometer output from 20 mHz to 1.0 Hz.

FIG. 5 exhibits a power spectrum analyzer measurement of the differential output demonstrating a minimum detectable differential field fluctuation $[\Delta B]_{RMS} = [\Delta \epsilon']RMS/G\eta'$ of 23 pT/$\sqrt{(Hz)}$ at 1.0 Hz for the 3 cm. coil separation. RMS voltage at 1.0 Hz corresponds to RMS differential field fluctuation (unity signal/noise) of 23 pT/√(Hz) with $\eta'=2.0$ nV/pT and $G=5 \times 10^4$.

Figure 6:
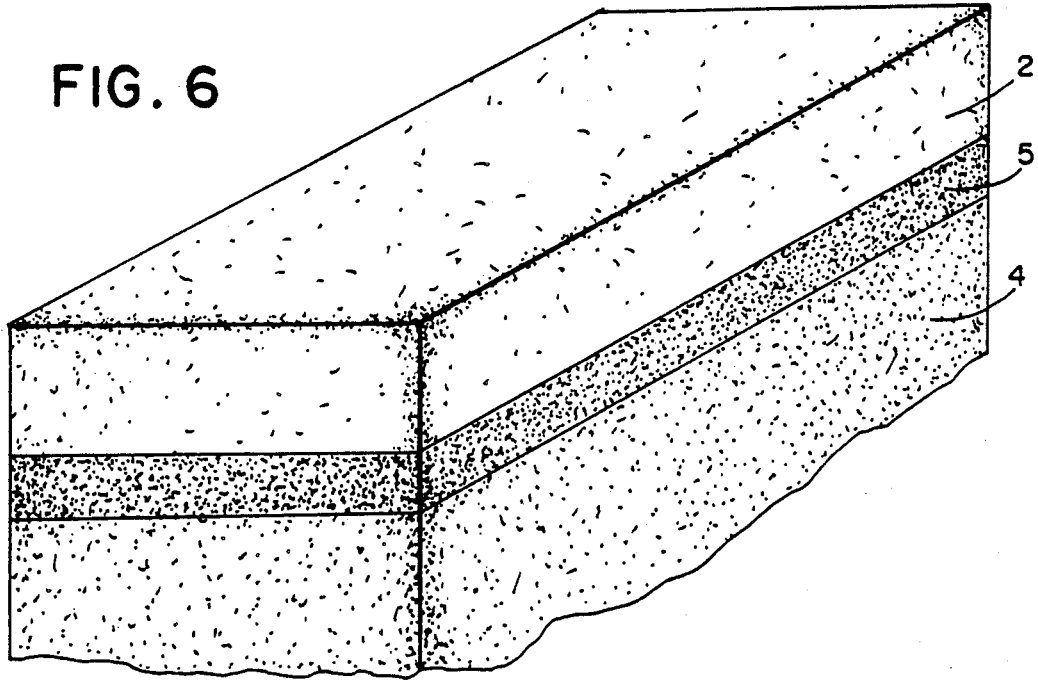
FIG. 6 shows a schematic drawing of the gradiometer illustrating the intervening viscous fluid layer between the plate and ribbon.

FIG. 6 illustrates the intervening viscous fluid layer 5 between the metallic glass ribbon 2 and the piezoelectric plate 4. This intervening viscous fluid layer efficiently transfers the dynamic stress (corresponding to the acoustic resonance) from the piezoelectric plate to the metallic glass ribbon while attenuating low frequency stresses which generate noise.

The present invention provides a new magnetic field gradiometer which exhibits a minimum detectable field gradient of 7.7 pT/cm.√(Hz) at 1.0 Hz. The sensor element uses a single metallic glass ribbon, thereby enhancing common-mode rejection of noise and providing a compact probe. Balancing is achieved by adjusting the individual amplifier gains. Configuring the pickup coils in series opposition in a sensor exhibiting an improved uniformity of response may obviate the need for that additional signal processing.

While the invention has been described with reference to a specific embodiment, modifications and variations of the invention may be made without departing from the scope of the invention.

I claim:

1. A magnetostrictive gradiometer comprising a piezoelectric resonator, an oscillator connected to the piezoelectric resonator for vibrating the resonator, a single magnetostrictive amorphous metal sensor element mounted on the resonator, whereby vibrating the resonator vibrates the amorphous metal sensor element, first and second pickups mounted near the single magnetostrictive amorphous metal sensor element at first and second spaced positions for picking up field changes at two distinct special points on the single sensor element, first and second amplifiers with unbalanced gains respectively connected to the first and second pickups and a differential amplifier connected to outputs of the first and second amplifiers for producing an output signal from the differential amplifier which is related to difference in a magnetic field between the two spaced locations, first and second lock-in amplifiers respectively connected between the first and second pickups and the first and second amplifiers, the oscillator being connected to the first and second lock-in amplifiers for demodulating signals from the pickup coils provided to the first and second amplifiers.

2. The apparatus of claim 1, wherein the first and second amplifiers have gain adjusters for balancing magnetic field detection sensitivity of each pickup.

3. The apparatus of claim 1, wherein the amorphous metal sensor element is a metallic glass ribbon which has been subjected to a transverse and planar field annealing treatment to produce a planar stripped domain structure.

4. The apparatus of claim 3, wherein the resonator produces a modulation in the longitudinal magnetization of the ribbon, which by virtue of magnetostriction is proportional to the low frequency magnetic field.

5. The method of measuring magnetic field gradient, comprising producing regular standing wave local stress modulation in a single magnetostrictive amorphous metal sensor element by mounting the sensor element on a piezoelectric resonator and resonating the resonator with a signal from an oscillator, generating electromotive forces in each of two spacially separated pickup coils mounted along the sensor element, demodulating the electromotive forces according to stress modulation produced in the sensor element separately amplifying the first and second electromotive forces and determining magnetic field gradient between locations of the two pickup coils according to a difference in the amplified electromotive forces, wherein the demodulating comprises providing the output of the oscillator to first and second lock-in amplifiers, for demodulating the electromotive forces from the pickup coils provided to first and second amplifier with unbalanced gains.

6. The method of claim 5, wherein the amplifying further comprises amplifying the first and second electromotive forces with different gains according to differences in the sensor element and piezoelectric resonator.

7. The method of claim 5, wherein the comparing comprises supplying the amplified first and second electromotive forces to a differential amplifier and providing magnetometer output from the differential amplifier.

* * * * *